United States Patent [19]

Sanborn et al.

[11] Patent Number: 4,916,808
[45] Date of Patent: Apr. 17, 1990

[54] PROCESS FOR FABRICATING A SCULPTURED STRIPLING INTERFACE CONDUCTOR

[75] Inventors: James A. Sanborn, Satellite Beach; Janet D. Sadlon, Melbourne; Marc H. Popek, Indian Harbour Bch.; Ralph D. DiStefano, Palm Bay, all of Fla.

[73] Assignee: Harris Corporation, Melbourne, Fla.

[21] Appl. No.: 158,802

[22] Filed: Feb. 22, 1988

[51] Int. Cl.[4] ................................................ H01P 5/12
[52] U.S. Cl. ........................................ 29/847; 29/600; 29/830; 29/852; 333/1; 333/246; 361/406; 439/55
[58] Field of Search ................. 29/600, 830, 847, 852; 174/52.1; 333/1, 238, 246, 247; 361/401, 406, 414; 439/55

[56] References Cited

U.S. PATENT DOCUMENTS 4,720,690 1/1988 Popek et al. ............................. 333/1

Primary Examiner—Timothy V. Eley
Attorney, Agent, or Firm—John L. DeAngelis, Jr.

[57] ABSTRACT

A process for forming a stripline interface conductor. A stripline interface conductor receives a circuit element and provides spaced-apart connections to each of the closely spaced leads of the circuit element. A first ground plane layer and an attached dielectric layer are perforated to create a first access opening and a plurality of second access openings. The plurality of second access openings are spaced at a distance from the first access opening so that closely spaced leads of the circuit element can be attached to signal traces at the first access opening and electrical connection can be made to the leads in a spaced-apart geometry at the plurality of smaller access openings. A second dielectric layer including top and bottom metallic layers is attached to the exposed side of the first dielectric layer. Before this attachment the top metallic surface of the second dielectric is etched to form the signal traces and a third access opening is formed through all three layers. The two pieces are bonded using a liquid adhesive and the first access opening is placed in registry with the third access opening. The circuit element is electrically connected to the signal traces using the portion of the signal traces exposed through the registered holes. Spaced apart connections to the leads of the circuit element are provided through the plurality of spaced-apart second access openings.

4 Claims, 3 Drawing Sheets

PROCESS FOR FABRICATING A SCULPTURED STRIPLING INTERFACE CONDUCTOR

This invention was made with Government support under Contract No. MDA 904-85-C-6062. The Government has certain rights in this invention.

FIELD OF THE INVENTION.

This invention relates to a method for making a stripline circuit having spaced-apart terminals so that a circuit element having closely spaced leads can be connected via the stripline circuit or other devices or to connectors at conveniently spaced-apart terminals.

BACKGROUND OF THE INVENTION

Microstrip and stripline have become increasingly popular transmission line media for short distance, low power applications, including RF microwave circuits and high speed digital circuits. Stripline consists of a printed conductor between two ground planes, typically formed from copper-clad polyethylene sheets. Electrically, stripline has properties similar to coaxial cable transmission lines.

Microstrip is a popular transmission line due to ease of fabrication and circuit assembly. Microstrip has a single ground plane with a dielectric layer sandwiched between a layer of circuit conductors and the ground plane. The circuit conductors are formed by either depositing metal on or etching metal away from the top surface. Generally, microstrip has greater signal attenuation than stripline, and also the power handling capability of microstrip is lower. Stripline provides inherently better crosstalk (i.e., neighboring channel interference) performance because the field within a stripline conductor is totally contained between the two ground planes, whereas microstrip has only a single ground plane. Although crosstalk interference is greater with microstrip, the exposed microstrip conductors are convenient for attaching circuit elements and thus microstrip is typically used for applications requiring the attachment of circuit elements to the board. To reduce crosstalk in a microstrip embodiment, thin signal traces and a thin microstrip board are used.

One common microstrip application is to provide RF signals to transducers of an acousto-optic Bragg cell. In typical applications, the Bragg cell may have 64 or 128, transducers, each responsive to a different RF signal. Because the microstrip conductors are exposed, it is relatively easy to attach the Bragg cell transducers to the microstrip, but crosstalk performance is less than optimum because the microstrip has a conductive ground plane on only one surface. Microstrip can also be used to interface VHSIC (very high-speed integrated circuit) elements and connect VHSIC elements to other devices. Because microstrip is a form of transmission line, it provides the necessary high-speed performance for VHSIC configured devices or any high-speed circuits.

Because stripline offers better crosstalk performance than microstrip, it is desirable to use stripline in lieu of microstrip whenever possible. But since the stripline conductor is sandwiched between the two ground planes, it is difficult to easily access the stripline signal line conductors. One technique for overcoming this difficulty is described and claimed in the commonly assigned U.S. Pat. No. 4,720,690 issued on Jan. 19, 1988, which is hereby incorporated by reference. This patent, entitled Sculptured Stripline Interface Conductor, provides a technique for connecting a circuit element having closely spaced leads to other devices at spaced-apart connections, using a stripline interconnection apparatus. The invention solves the problems of accessing the buried signal lines of the stripline conductor so that a circuit element with closely spaced leads can be attached to one end of the signal line, and spaced-apart connections are available for attaching a connector or other component. The signal lines are closely spaced at the circuit element attach point and spaced farther apart at the connector end.

FIGS. 1 and 2 illustrate a sculptured stripline interface conductor as described in the commonly-assigned patent referenced above. FIG. 1 is a top view and FIG. 2 provides a cross sectional illustration of a sculptured stripline interface conductor 10. Both FIGS. 1 and 2 show a circuit element 18 attached to a signal trace 14. The sculptured stripline interface conductor 10 comprises an upper ground plane 12, a dielectric layer 13, the circuit traces 14, a dielectric layer 15, and a lower ground plane 16. Before the assembly is laminated together, a first hole 22 is cut within the ground plane 12 and the dielectric layer 13. A differently sized hole 24 is cut within the circuit trace layer 14, the dielectric layer 15, and the lower ground plane 16. In FIGS. 1 and 2 the circuit element 18 is a Bragg cell including a plurality of transducers 20 that can be seen clearly in FIG. 1. Because the holes 22 and 24 have different sizes, a portion of the signal trace 14 is exposed for attaching a transducer 20 thereto with a bond wire 25. The point at which the bond wire 25 is attached to the signal trace 14 is designated by reference character 26.

To access the signal line 14 at the periphery of the sculptured stripline interface conductor 10 (i.e., outwardly away from the rectangular holes 22 and 24) additional access holes 53 are cut in the top ground plane 12 and the dielectric layer 13 before lamination. These holes 53 reveal connection pads 30 in the circuit traces 14, providing a connection point for an electrical connection to the transducers 20 via the signal traces 14. Each signal trace 14 begins at a pad 30 and runs to the rectangular holes 22 and 24 where the other end is exposed, as clearly illustrated in FIG. 2. Thus each signal trace 14 is exposed only at the pad 30 where a wire, connector, or circuit element can be attached, and again at the hole 22 where the circuit element 18 is attached. With this invention, the exceptional crosstalk performance of stripline is advantageously available in an application where previously only microstrip could be used. The crosstalk performance is not significantly degraded by exposing the small portions of the signal trace 14 at the pads 30 and in the area of the hole 22.

Construction of the sculptured stripline interface conductor 10, according to the prior art commonly assigned patent, is accomplished as follows. As is well know by those skilled in the art, the upper ground plane 12 and the dielectric layer 13 are commercially available as a single piece. Also, the signal traces 14, the dielectric layer 15, and the lower ground plane 16 are available as a single piece; the signal traces 14 are formed in the upper conductive surface using well-known etching techniques. After the various layers are sculptured, etched, and drilled as required, the two pieces are bonded using a bond film (available from Minnesota Mining and Manufacturing Company; 3-M Center; St. Paul, Minn. 55144) that is inserted between the two pieces. Pressure and heat are then applied so that the bond film laminates the pieces together. In one embodiment this is accomplished by drawing a 14.5 psi vacuum and holding the temperature at 260° F. The assembly is then cooled and the vacuum is released.

The primary disadvantage of this prepregnated film adhesive technique is the requirement that the film be removed in all areas where the signal trace 14 is exposed for connection. This includes the area of the pads 30 and also the area where the signal trace 14 is exposed due to the differently sized holes 22 and 24. Removal of the film adhesive after the structure has been laminated together is a difficult and time consuming process. Typically, it is impossible to completely remove the film adhesive from the sculptured areas. Thus, it is advantageous to utilize a different process, especially in those embodiments where there will be a large number of exposures of the signal trace 14.

It is also extremely difficult to perform selective bonding with the prior art technique. Selective bonding is the process of masking areas that are to be free from adhesive using a liquid tape that can be removed after the adhesive cures. If the prior art film adhesive is used, all the areas to be free of adhesive must be removed from the film, which is a labor-intensive process.

Although the prior art thin film adhesives provide a continuous thickness with known dielectric properties, there are other disadvantages associated with this technique. After the sculptured stripline interface conductor is laminated together, drilling operations through the interface conductor result in delamination around the drilled holes. The delamination is unacceptable and prevents high quality through-plating of these holes.

SUMMARY OF THE INVENTION

The objective of the present invention is to provide a bonding method for a sculptured stripline interface conductor where the interface conductor comprises two pieces bonded together. One piece is a dielectric substrate with a circuit topography on its upper face; the other piece is a dielectric surface having certain sculptured areas removed. The objective is to provide a strong structural bond with good electrical properties between the contact surfaces of each piece and further ensure that the circuit traces and sculptured areas are kept free from adhesion of the bonding agent.

The objectives of this invention are accomplished by using a liquid adhesive to eliminate the problems associated with adhesion of the bonding agent to the circuitry in the sculptured areas. Further, with the present novel technique the labor required to construct the sculptured stripline interface conductor is greatly reduced. Further, the electrical properties of the final product can be tailored by the amount of the adhesive sprayed onto an area. Using the prior art thermoplastic adhesive film, it is virtually impossible to do the selective sculpturing and selective bonding that can be accomplished with the present invention. Also, some electronic properties of the sculptured stripline interface conductor, such as dielectric strength and dissipation factor, can be controlled with the technique of the present invention.

The method for bonding the two surfaces requires clean bonding surfaces. The etched circuitry on the top face of the second piece is masked to prevent liquid adhesive from coming into contact with the circuitry. The bonding surfaces are then sprayed with the liquid adhesive, placed in contact with each other, and properly aligned. A vacuum is applied, and the bonded surfaces are held under pressure until the curing process has stopped. Lastly, the protective material placed upon the circuit traces is removed. Application of the spray-adhesive can be done in such a manner so as to desirably influence the dielectric strength and dissipation factor of the final assembly.

BRIEF DESCRIPTION OF THE DRAWINGS

The present invention may be better understood and the further advantages and uses thereof more readily apparent, when considered in view of the following detailed description of exemplary embodiments, taken with the accompanying drawings in which.

THE PREFERRED EMBODIMENTS

Figure 1:
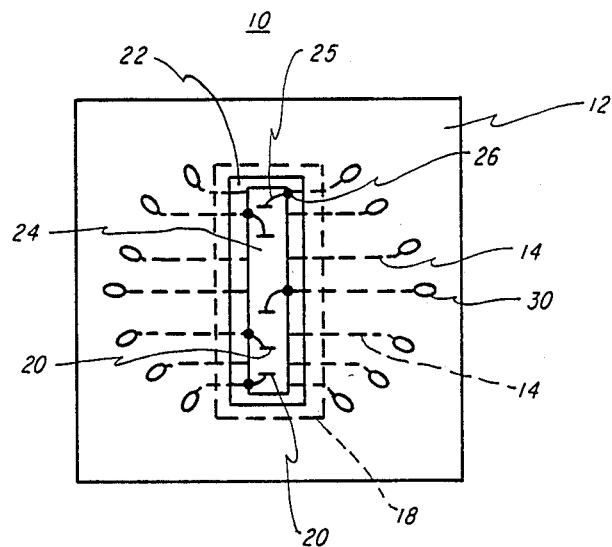
FIG. 1 is a top view of a first embodiment of a stripline interface conductor constructed according to the teachings of the present invention.
Figure 2:
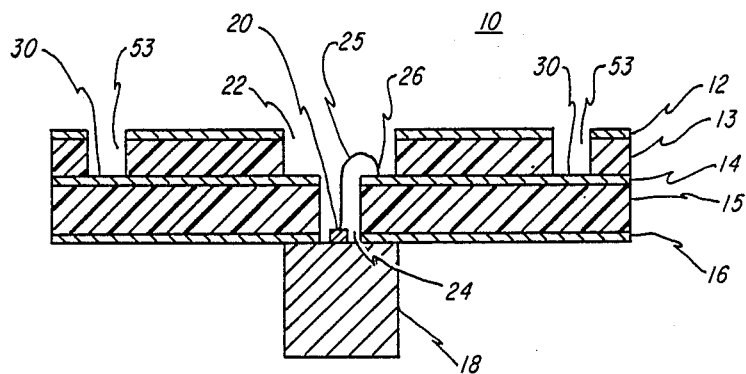
FIG. 2 is a side cross section of the stripline interface conductor of FIG. 1.

Construction of the stripline interface conductor 10 according to the teachings of the present invention is best illustrated with reference to the exploded view of FIG. 4. As is well known by those skilled in the art, the upper ground plane 12 and the dielectric layer 13 are commercially available as a single piece designated by the reference character 40. First, the upper ground plane conductor 12 and the dielectric layer 13 are perforated to make the holes 53 for exposing the pads 30. In FIG. 4 a lead 62 is shown soldered to a pad 30. The pads 30 can be seen clearly in the top view of FIG. 3. Also at this time, the rectangular access opening 22 is formed. A piece 58 comprises the dielectric layer 15 sandwiched between a copper-clad face in which the signal traces 14 are etched, and a lower ground plane 16. A rectangular hole 24 is cut in the lower ground plane 16, the dielectric layer 15, and the signal traces 14. Next holes 60 (see FIG. 3) are cut in the upper ground plane conductor 12, the dielectric layers 13 and 15, and the lower ground plane 14. The holes 60 are not visible in FIG. 4 because the FIG. 4 cross section is formed by plane cutting through the signal traces 14.

In one embodiment, the signal traces 14 are five mils wide and one mil thick, and a special etching technique described below is necessary to produce lines of this dimension. A selective gold deposition process can be used to manufacture the sculptured stripline interface conductor 10 to provide a stripline circuit having the desired closely spaced conductors. Conventional one ounce cooper-clad circuitboard is chemically reduced to between 0.5 and 0.75 ounces. After a thorough cleaning, photo resist is applied to define the conductive pattern, i.e., the signal traces 14. The bare signal traces are then selectively gold plated, and the photo resist material is removed leaving the thin copper layer 0.007 to 1.0 mil. The remaining gold plated signal traces 14 act as a resist material when the unwanted copper material is etched away using a 20 percent ferric-chloride solution as the etchant. A brushing technique is used to uniformly etch the thin copper layer to eliminate undercutting of signal traces that is associated with conventional printed wiring board etching techniques. These well defined signal traces 14 ensure lower losses and reduce line impedance and electrical crosstalk.

The adhesive material used to bond the pieces 40 and 58 is Conathane CE-1155 available from Conap Corporation, Olean, N.Y. This adhesive is a two-component (plus solvent) solvent-based polyurethane coating system that is typically used for protecting printed circuit assemblies and electrical components in adverse environments. It provides outstanding resistance to moisture and good abrasion resistance. The cured adhesive is hard, tough, and offers excellent adhesion to phenolic and epoxy glass laminants. The adhesive may be applied by spray, dip, or brush techniques and cures at room or elevated temperatures. The cured adhesive has an operational temperature range up to 130° C. Although the adhesive is a two-component system with solvent, in this invention it is used without the solvent thinning diluent normally used in coating applications. Using this adhesive system without the thinning diluent component (i.e., the solvent) allows the elements of the adhesive component to serve as active diluents that are bound into the polyurethane and eliminate outgassing problems. Conathane CE-1155 is one example of a liquid adhesive that is effectively used in the present invention. Other liquid adhesives from other vendors are available and can provide the required bond strength and electrical characteristics required by the present invention. For example, adhesive PR 1568 from Products Research and Chemical Corporation, Gloucester, N.J. is also suitable.

The bonding process begins by first preparing the piece 58 by vapor blasting and cleaning with isopropyl alcohol. Piece 58 is a glass/epoxy surface with the signal traces 14 etched on the top surface. Next the piece 40, which in one embodiment, has a teflon surface on the bottom side, is prepared for bonding by vapor blasting and tetra etching. In other embodiments, any plastic dielectric laminate can be used as the piece 40. One of the objectives of this technique is to ensure that the signal traces 14 do not have any adhesive thereon, thus the signal traces 14 are protected by covering with a liquid latex material. In one embodiment the liquid latex is part number CAT-101 available from Catalina Laboratories, Altadena, CA. In those embodiments where the signal traces 14 are extremely small, it may be necessary to perform the latex masking operation using a hypodermic needle and working under a microscope. The liquid latex must be cured before the next process step; in one embodiment the curing is accomplished at 55° C. for thirty minutes.

The resin and catalyst components of the liquid adhesive, in one embodiment Conathane's CE-1155, are mixed and sprayed onto the bonding side of the piece 40. In one embodiment the adhesive was sprayed to a wet film thickness of approximately 1-2 mils using a four-way box coat applied with an air brush. The glass/epoxy piece 58 is placed on a flat surface with the signal traces 14 facing up. In one embodiment this flat surface is a bonding tool with alignment pins for precise alignment between the pieces 40 and 58. Next the teflon piece 40 with the sprayed side down is placed atop the glass/epoxy 58, again using the alignment tool pins for proper alignment. A vacuum bag is used to apply a vacuum of 14.5 psi to the assembly, and cured at 75° C. for approximately two hours. The sculptured stripline interface conductor 10 is then cooled under pressure before the vacuum is released and the assembly is removed from the bonding tool. Lastly the latex is removed from the exposed portions of the signal traces 14.

Figure 3:
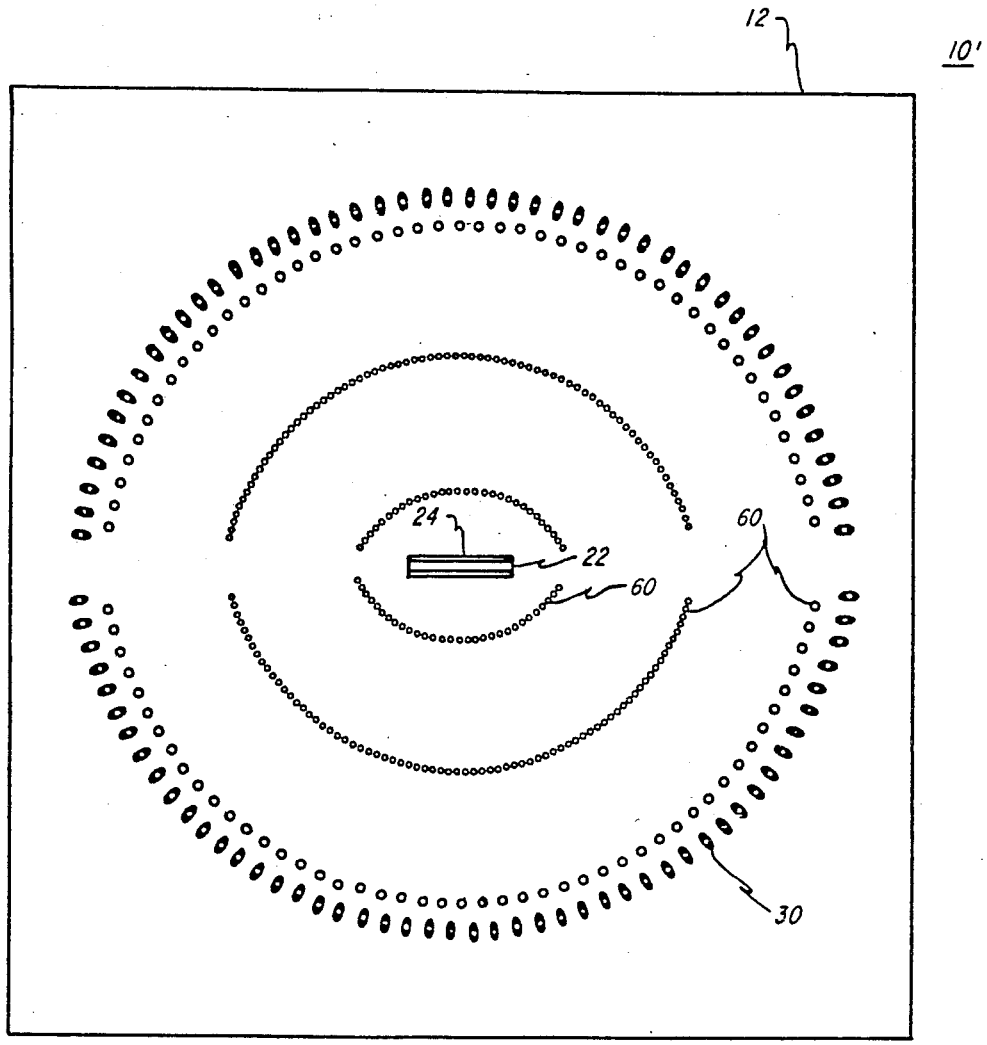
FIG. 3 is a top view of the upper ground plane of a second embodiment of the present invention.
Figure 4:
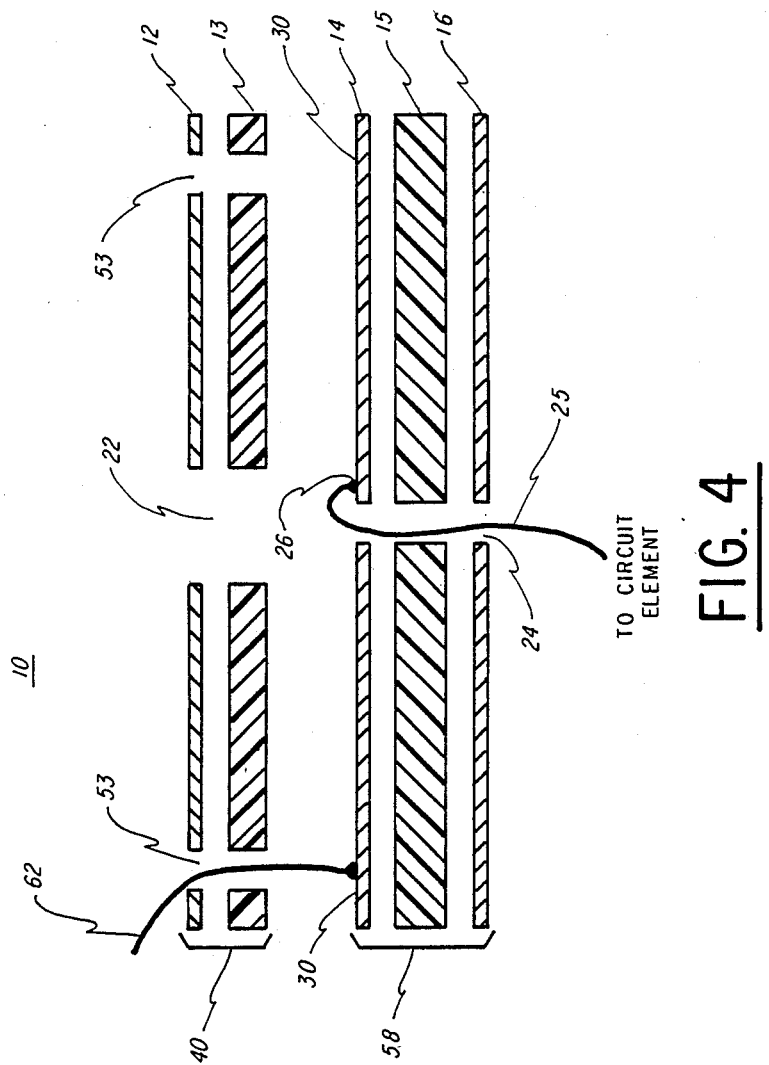
FIG. 4 depicts the process for constructing a stripline interface conductor according to the present invention.

As shown in FIG. 3, there are a plurality of holes 60 that are plated through from the upper ground plane 12 to the lower ground plane 16. The holes 60 are drilled after the assembly is completed. To provide a common ground, wires are laced through the holes 60 from the upper ground plane 12 to the lower ground plane 16. If one or more of the holes 60 are drilled prior to assembly of the pieces 40 and 58, these holes 60 can serve as alignment keys. Specifically, pins in the bonding tool can be inserted through one of the holes 60 in the glass/epoxy piece 58 when it is loaded on the bonding tool. The pins can then be inserted through holes in the teflon piece 40 when it is laid atop the glass/epoxy piece 58.

The electrical and physical bonding properties of the CE-1155 adhesive system are sufficient for the sculptured stripline interface conductor 10. Also, the drilling problems associated with the prior art film adhesives have been eliminated as there has been limited delamination around holes drilled after assembly.

While we have shown and described several embodiments in accordance with the present invention, it is understood that the same is not limited thereto but is susceptible of numerous changes and modifications as know to a person skilled in the art, and we therefore do not wish to be limited to the details shown and described herein, but intend to cover all such charges and modifications as are obvious to one of ordinary skill in the art.

What is claimed is:

1. A method for forming a stripline interface conductor adapted for receiving a circuit element and providing spaced-apart connections to each lead of the circuit element, said method comprising the steps of:
    forming a first access opening and a plurality of second access openings in a first piece having a conductive layer atop a dielectric layer, wherein said plurality of second access openings are spaced at a predetermined distance from said first access opening;
    in a second piece having a dielectric layer between a top and a bottom conductive layer, forming a plurality of signal traces on said top conductive layer;
    masking said plurality of signal traces by applying a masking material thereto;
    forming a third access opening in said second place, wherein said third access opening is smaller than said first access opening;
    applying a liquid adhesive to at least one of said dielectric layer of said first piece and said top conductive layer of said second piece;
    placing said dielectric layer of said first piece proximate said top conductive layer of said second piece, and wherein said first access opening is in registry with said third access opening, wherein a first portion of at least one of said plurality of signal traces is exposed through said first access opening, and wherein a second portion of at least one of said plurality of signal traces is accessible through one of said plurality of second access openings, and wherein said circuit traces are closely spaced near said first access opening and are spaced farther apart near said plurality of second access openings;
    removing the masking material from exposed portions of said signal traces.

2. The method of claim 1 wherein the liquid adhesive is applied by spraying.

3. A stripline interface conductor, adapted for receiving a circuit element and providing spaced-apart connections to each lead of the circuit element, made by the method comprising the steps of:

forming a first access opening and a plurality of second access openings in a first piece having a conductive layer atop a dielectric layer, wherein said plurality of second access openings are spaced at a predetermined distance from said first access opening;

in a second piece having a dielectric layer between a top and a bottom conductive layer, forming a plurality of signal traces on said top conductive layer;

masking said plurality of signal traces by applying a masking material thereto;

forming a third access opening in said second piece, wherein said third access opening is smaller than said first access opening;

bonding said first piece to said second piece by applying a liquid adhesive to at least one of said dielectric layer of said first piece and said top conductive layer of said second piece, wherein said dielectric layer of said first piece is located proximate said top conductive layer of said second piece, and wherein said first access opening is in registry with said third access opening, wherein a first portion of at least one of said plurality of signal traces is exposed through said first access opening, and wherein a second portion of at least one of said plurality of signal traces is accessible through one of said plurality of second access openings, and wherein said circuit traces are closely spaced near said first access opening and are spaced farther apart near said plurality of second access openings;

removing the masking material from exposed portions of said signal traces.

4. The stripline interface conductor of claim 3 wherein the liquid adhesive is applied by spraying.

* * * * *

UNITED STATES PATENT AND TRADEMARK OFFICE
CERTIFICATE OF CORRECTION

PATENT NO. : 4,916,808

DATED : April 17, 1990

INVENTOR(S) : James A. Sanborn et al

It is certified that error appears in the above-identified patent and that said Letters Patent is hereby corrected as shown below:

ON THE TITLE PAGE:

The title of the patent should read as follows:

PROCESS FOR FABRICATING A SCULPTURED STRIPLINE INTERFACE CONDUCTOR

Signed and Sealed this

Eighth Day of October, 1991

Attest:

HARRY F. MANBECK, JR.

*Attesting Officer*  *Commissioner of Patents and Trademarks*